(12) United States Patent
Yan et al.

(10) Patent No.: US 9,543,324 B2
(45) Date of Patent: Jan. 10, 2017

(54) ARRAY SUBSTRATE, DISPLAY DEVICE AND MANUFACTURING METHOD OF THE ARRAY SUBSTRATE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Changjiang Yan, Beijing (CN); Jiaxiang Zhang, Beijing (CN); Jian Guo, Beijing (CN); Zhenyu Xie, Beijing (CN); Xu Chen, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 194 days.

(21) Appl. No.: 14/386,651

(22) PCT Filed: Dec. 3, 2013

(86) PCT No.: PCT/CN2013/088384
§ 371 (c)(1),
(2) Date: Sep. 19, 2014

(87) PCT Pub. No.: WO2015/000255
PCT Pub. Date: Jan. 8, 2015

(65) Prior Publication Data
US 2016/0211277 A1 Jul. 21, 2016

(30) Foreign Application Priority Data

Jul. 3, 2013 (CN) .......................... 2013 1 0277079

(51) Int. Cl.
*H01L 29/10* (2006.01)
*H01L 27/12* (2006.01)
(Continued)

(52) U.S. Cl.
CPC ......... *H01L 27/1222* (2013.01); *H01L 27/124* (2013.01); *H01L 27/1248* (2013.01);
(Continued)

(58) Field of Classification Search
CPC .............. H01L 27/1222; H01L 27/124; H01L 27/1248; H01L 27/1288; H01L 29/66765; H01L 29/78669
(Continued)

(56) References Cited

U.S. PATENT DOCUMENTS 6,132,800 A * 10/2000 Shimada ........... G02F 1/133516
427/108
6,879,360 B2 * 4/2005 Kang ................ G02F 1/133512
349/110
(Continued)

FOREIGN PATENT DOCUMENTS

CN 103383945 A 11/2013
CN 203312295 U 11/2013

OTHER PUBLICATIONS

International. Search Report Appln. No. PCT/CN2013/088384; Dated Mar. 12, 2014.
(Continued)

*Primary Examiner* — Tod T Van Roy
*Assistant Examiner* — Vu A Vu
(74) *Attorney, Agent, or Firm* — Ladas & Parry LLP

(57) ABSTRACT

An array substrate, a display device and a manufacturing method of the array substrate. The array substrate includes: a base substrate (1) and a plurality of pixel units located on the base substrate (1), each of the pixel units including a thin
(Continued)

film transistor unit. The thin film transistor unit includes: a gate electrode located on the base substrate (1), a gate insulating layer (3) located on the gate electrode, an active layer (4) located on the gate insulating layer (3) and opposed to the gate electrode in position, an ohmic layer (5) located on the active layer (4), a source electrode (6a) and a drain electrode (6b) that are located on the ohmic layer (5) and a resin passivation layer (8) that are located on the source electrode (6a) and the drain electrode (6b) and covers the substrate.

19 Claims, 6 Drawing Sheets

(51) Int. Cl.
*H01L 29/66* (2006.01)
*H01L 29/786* (2006.01)
(52) U.S. Cl.
CPC .... *H01L 27/1288* (2013.01); *H01L 29/66765* (2013.01); *H01L 29/78669* (2013.01)

(58) Field of Classification Search
USPC ............................................. 257/59
See application file for complete search history.

(56) References Cited

U.S. PATENT DOCUMENTS

| | | | |
|---|---|---|---|
| 7,982,840 B2* | 7/2011 | Segawa | G02F 1/134363 349/141 |
| 2007/0111412 A1* | 5/2007 | Oh | H01L 21/0273 438/158 |
| 2009/0053844 A1 | 2/2009 | Huang et al. | |
| 2009/0148987 A1 | 6/2009 | Liao et al. | |
| 2010/0045912 A1* | 2/2010 | Chen | G02F 1/13394 349/122 |

OTHER PUBLICATIONS

First Chinese Office Action Appln. No. 201310277079.8; Dated Apr. 10, 2015.
International Preliminary Report on Patentability issued Jan. 5, 2016; PCT/CN2013/088384.

* cited by examiner

ARRAY SUBSTRATE, DISPLAY DEVICE AND MANUFACTURING METHOD OF THE ARRAY SUBSTRATE

TECHNICAL FIELD

Embodiments of the present invention relate to an array substrate, a display device and a manufacturing method of the array substrate.

BACKGROUND

Among flat panel display devices, Thin Film Transistor Liquid Crystal Displays (TFT-LCDs) have features of small volume, low power consumption, relatively low production cost, irradiation-free, etc., and play a leading role in the current market for flat panel displays.

Currently, the display mode of TFT-LCDs mainly includes a TN (Twisted Nematic) mode, a VA (Vertical alignment) mode, an IPS (In-Plane-Switching) mode, an AD-SDS (ADvanced Super Dimension Switch, briefly called as ADS) mode, etc.

Resin passivation layers have features of flat surface, low dielectric constant and so on, and therefore, in the actual production of a TFT-LCD array substrate, a resin passivation layer is usually introduced to further improve aperture ratio and display brightness of the TFT-LCD product, to reduce signal delay of the TFT-LCD product, and to ultimately enhance competitive power of the product.

With a TFT-LCD array substrate of an ADS mode as an example, the array substrate includes: a set of gate scanning lines and a set of data scanning lines, a plurality of pixel units that are defined by the set of gate scanning lines and the set of data scanning lines and are arranged in the form of an array. Each layer of the array substrate is generally formed by a patterning process, and each patterning process usually includes masking, exposure, development, etching, stripping and other procedures.

As regards an existing array substrate, a channel protective layer (for protecting a channel) and a resin passivation layer are sequentially formed after formation of a source electrode and a drain electrode during its manufacture. Thus, the manufacturing cost of the array substrate is relatively high, and the manufacturing process is relatively complex. This easily leads to product defects.

SUMMARY

One of objects of the invention is to provide an array substrate, a display device and a manufacturing method of the array substrate, capable of effectively decreasing the production cost of the array substrate, greatly simplifying the manufacturing process, and further raising yield of the product.

According to an embodiment of the invention, there is provided an array substrate, comprising: a base substrate and a plurality of pixel units located on the base substrate, each of the pixel units including a thin film transistor unit, wherein, the thin film transistor unit includes: a gate electrode located on the base substrate, a gate insulating layer located on the gate electrode, an active layer located on the gate insulating layer and opposed to the gate electrode in position, an ohmic layer located on the active layer, a source electrode and a drain electrode that are located on the ohmic layer and a resin passivation layer that are located on the source electrode and the drain electrode and covers the substrate.

According to another embodiment of the invention, there is provided a display device, comprising the array substrate as stated in the forgoing technical solution.

According to still another embodiment of the invention, there is provided a manufacturing method of an array substrate, comprising:

forming a data line metal thin film that is located on an active layer and an ohmic layer and covers a substrate, so as to form source/drain metal, a metal wire and a data scan line through a patterning process;

forming a resin passivation layer that is located on the source/drain metal, the metal wire and the data scan line and covers the substrate, so as to form a second via hole, a third via hole and a fourth via hole of the resin passivation layer through a patterning process, the second via hole being in correspondence with a position where a drain electrode is to be formed, the third via hole being in correspondence with the position of the metal wire, the fourth via hole being in correspondence with a position between a source electrode and the drain electrode where a channel is to be formed;

forming a transparent, conductive metal thin film that is located on the resin passivation layer and covers the substrate, so as to form the source electrode, the drain electrode, a fifth via hole of the ohmic layer and a first transparent electrode through a patterning process, the fifth via hole being in correspondence with the position of the fourth via hole.

In technical solutions of embodiments of the invention, the resin passivation layer covers source/drain metal directly, and so, during manufacturing of the array substrate, after formation of the pattern of the source/drain metal, production of a channel protective layer is omitted. According to the invention, production cost of the array substrate is effectively reduced, manufacturing process is greatly simplified, display brightness of the TFT-LCD product is effectively enhanced, and yield of the product is raised.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but are not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) into the scope sought for protection by the invention.

One of objects of the invention is to provide an array substrate, a display device and a manufacturing method of the array substrate. A resin passivation layer of the array substrate covers a source/drain metal directly, and during manufacturing of the array substrate, production of a channel protective layer is omitted after formation of the pattern of the source/drain metal. According to the invention, it is possible that production cost of the array substrate is effectively reduced, manufacturing process is greatly simplified, and yield of the TFT-LCD product is raised effectively.

Figure 1:
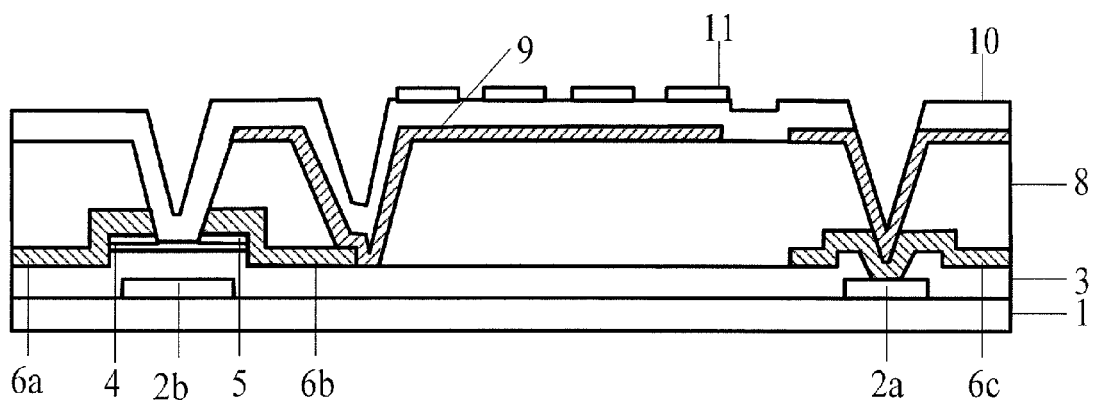
FIG. 1 is a schematically sectional view illustrating the structure of one pixel unit according to an embodiment of an array substrate of the invention (with an ADS mode as an example)

According to an embodiment illustrated in FIG. 1, an array substrate provided by the embodiment of the invention includes: a base substrate 1 and a plurality of pixel units located on the base substrate 1 (section of one pixel unit is illustrated in the figure as an example). The array substrate further includes a gate driver on array (GOA) unit. Each of the pixel units includes a thin film transistor unit.

The GOA unit includes: a first gate electrode 2a (i.e. a wire-zone gate electrode, referred to as a first gate electrode below) located on the base substrate 1, a gate insulating layer 3 located on the first gate electrode 2a and covering the substrate and a metal wire 6c located on the gate insulating layer 3. The thin film transistor unit includes: a second gate electrode 2b (i.e. a gate electrode of a thin film transistor, referred to as a second gate electrode below) located on the base substrate 1, an active layer 4 located on the gate insulating layer 3 and opposed to the second gate electrode 2b in position, an ohmic layer 5 located on the active layer 4, a source electrode 6a and a drain electrode 6b that are located on the ohmic layer 5 and a resin passivation layer 8 that are located on the source electrode 6a and the drain electrode 6b and covers the substrate.

For example, the GOA unit lies in a signal guiding zone on the periphery of the substrate. One pixel unit including a thin film transistor unit is exemplarily illustrated in the figure and the pixel unit is adjacent to the GOA unit, however, not all of the pixel units are adjacent to the GOA unit.

In embodiments of the invention, the base substrate 1 may be a glass substrate, a plastic substrate or a substrate of other material. Material for the first gate electrode 2a, the second gate electrode 2b, the source electrode 6a, the drain electrode 6b and the metal wire 6c may be a single-layered film of aluminum (Al), molybdenum (Mo) or an alloy of molybdenum and tungsten (MoW). Material for the gate insulating layer 3 may be silicon nitride. Material for the active layer 4 may be amorphous silicon (a-Si). Material for the ohmic layer 5 may be a doped semiconductor ($n^+$ a-Si).

The first gate electrode 2a and the second gate electrode 2b lie in the same layer.

As illustrated in FIG. 1, the array substrate further includes: a first transparent electrode 9 located on the resin passivation layer 8, a second passivation layer 10 located on the first transparent electrode 9 and covering the substrate, and a second transparent electrode 11 that is located on the second passivation layer 10 and has a slit structure.

Material for the first transparent electrode 9 and the second transparent electrode 11 may be indium tin oxide, or the like. The second passivation layer 10 may adopt an inorganic insulating film, such as of silicon nitride, or the like, or an organic insulating film, such as of a photosensitive resin material, a non-photosensitive resin material, or the like.

Material for the resin passivation layer 8 is preferably a photosensitive resin material.

For example, the resin passivation layer 8 contacts with the source electrode 6a and the drain electrode 6b directly. For example, the second passivation layer 10 contacts with the active layer directly.

In the array substrate provided by embodiments of the invention, the resin passivation layers 8 is located on the source electrode 6a and the drain electrode 6b and is laminated thereon to contact with them, and production of a channel protective layer is omitted. Therefore, according to the invention, production cost of the array substrate is reduced, and manufacturing process is greatly simplified. Furthermore, an inorganic insulating film of such as silicon nitride, or the like is usually used as the channel protective layer, and as for a visible light, the transmittance of the channel protective layer of silicon nitride is 90%, and the transmittance of a resin passivation layer is 95%. Therefore, with the array substrate as stated in embodiments of the invention, display brightness of the TFT-LCD product is further enhanced, yield of the product is raised, and power consumption of the TFT-LCD product is effectively reduced.

What is provided by embodiments of the invention is an array substrate of an ADS mode, and the picture quality of the TFT-LCD product can be improved with it. It has the merits of high resolution, high transmittance, low power consumption, wide viewing angle, high aperture ratio, low chromatic aberration, push Mura-free, and so on.

According to an embodiment of the invention, there is further provided a display device, comprising any of the array substrates as stated above. The display device may be: a liquid crystal panel, an electronic paper, an OLED panel, a cell phone, a tablet computer, a television, a display, a notebook computer, a digital photoframe, a navigator or any other product or component having a display function.

Figure 2:
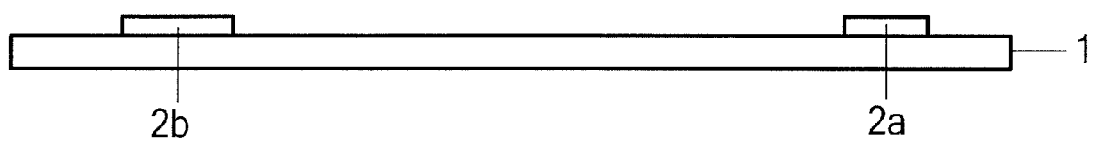
FIG. 2 is a schematically sectional view illustrating the structure of one pixel unit after formation of a gate electrode according to an embodiment of a method of the invention.

A manufacturing method of an array substrate according to an embodiment of the invention includes:

Step 301: a gate metal thin film is formed on a base substrate 1, so as to form patterns of a first gate electrode 2a, a second gate electrode 2b and a gate scan line (not illustrated in the figure) connected to the second gate electrode 2b through a patterning process. A sectional structure of one pixel unit after formation of the gate electrodes refers to that illustrated in FIG. 2.

One patterning process usually includes cleaning of a substrate, film formation, coating of photoresist, exposure, development, etching, stripping of the photoresist and other procedure. For a metal layer, a physical vapor deposition mode (such as magnetron sputter) is usually used for its film formation, and it is formed into a pattern by wet etching; while for a non-metal layer, a chemical vapor deposition mode is usually used for its film formation, and it is formed into a pattern by dry etching. The following steps work on the same principle, and details are omitted.

Figure 3:
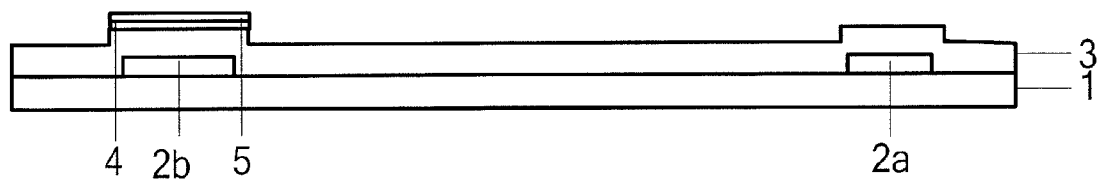
FIG. 3 is a schematically sectional view illustrating the structure of one pixel unit after formation of an active layer and an ohmic layer according to an embodiment of the method of the invention.

Step 302: a gate insulating layer 3, an active material layer and an ohmic material layer that cover the substrate are formed on the substrate subjected to the step 301, so as to form an active layer 4 and an ohmic layer 5 through a patterning process. A sectional structure of one pixel unit after formation of the active layer 4 and the ohmic layer 5 refers to that illustrated in FIG. 3.

In this step, preferably, the gate insulating layer 3, the active material layer and the ohmic material layer located on the patterns of the first gate electrode 2a, the second gate electrode 2b and the gate scan line are formed in sequence.

The active layer 4 and the ohmic layer 5 are formed by a patterning process using a half-tone mask. Material for the active material layer is amorphous silicon (a-Si), and material for the ohmic layer 5 is a doped semiconductor (n+ a-Si).

Figure 4:
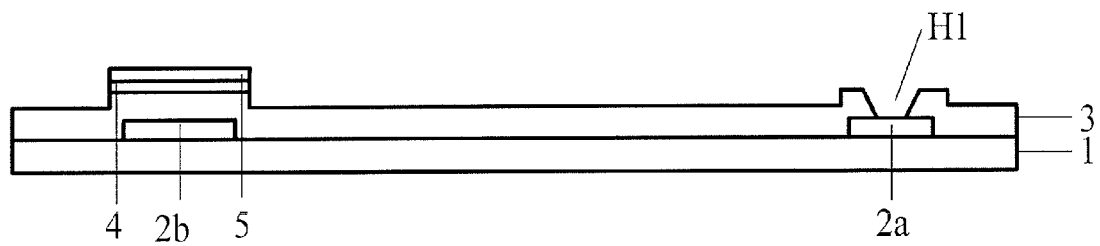
FIG. 4 is a schematically sectional view illustrating the structure of one pixel unit after formation of a first via hole of a gate insulating layer according to an embodiment of the method of the invention.

Step 303: a first via hole H1 of the gate insulating layer 3 is formed in a position corresponding to the first gate electrode 2a on the substrate subjected to the step 302 through a patterning process. A sectional structure of one pixel unit after formation of the first via hole H1 of the gate insulating layer 3 refers to that illustrated in FIG. 4.

Figure 5:
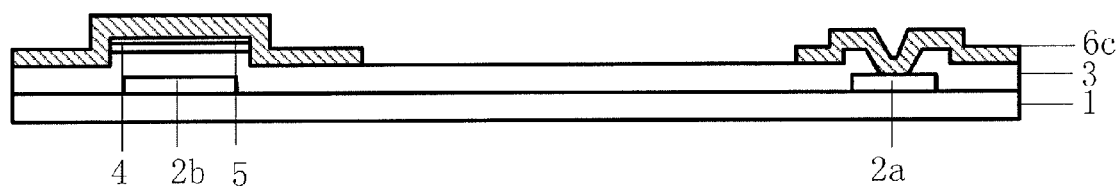
FIG. 5 is a schematically sectional view illustrating the structure of one pixel unit after formation of source/drain metal according to an embodiment of the method of the invention.
Figure 6:
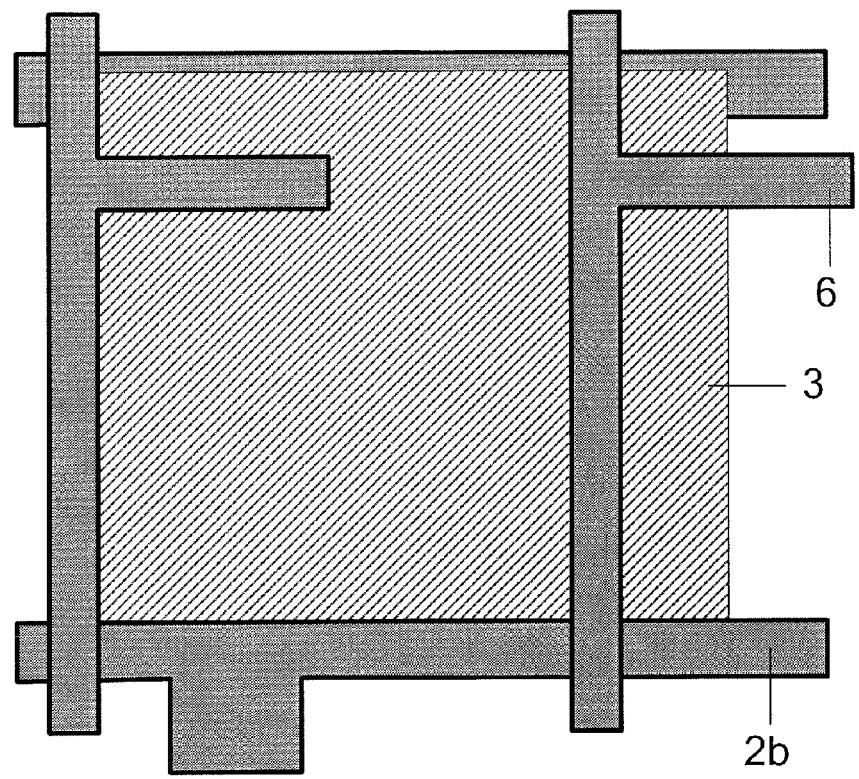
FIG. 6 is a schematically top view illustrating the structure of one pixel unit after formation of source/drain metal according to an embodiment of the method of the invention.

Step 304: a data line metal thin film covering the substrate is formed on the substrate subjected to the step 303, so as to form pattern of source/drain metal, pattern of a metal wire 5c and pattern of a data scan line (not illustrated in the figure) through a patterning process. The structure of one pixel unit after formation of source/drain metal refers to those illustrated in FIG. 5 and FIG. 6.

There is not a process for forming a source electrode 6a and a drain electrode 6b in this step, namely, a channel between the source electrode 6a and the drain electrode 6b has not been formed. The source/drain metal at this time functions as a channel protective layer temporarily, so that TFT characteristic of the channel is effectively protected.

Figure 7:
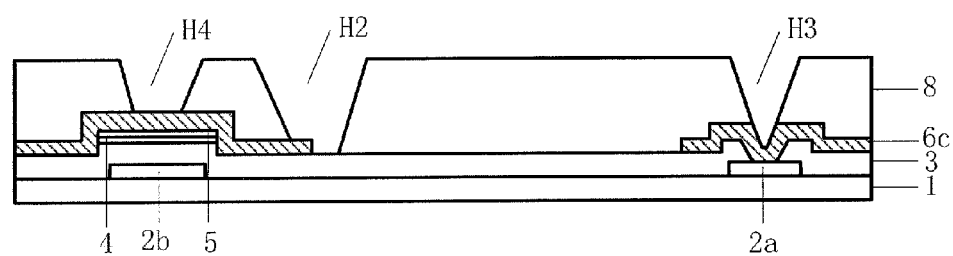
FIG. 7 is a schematically sectional view illustrating the structure of one pixel unit after formation of a resin passivation layer according to an embodiment of the method of the invention.
Figure 8:
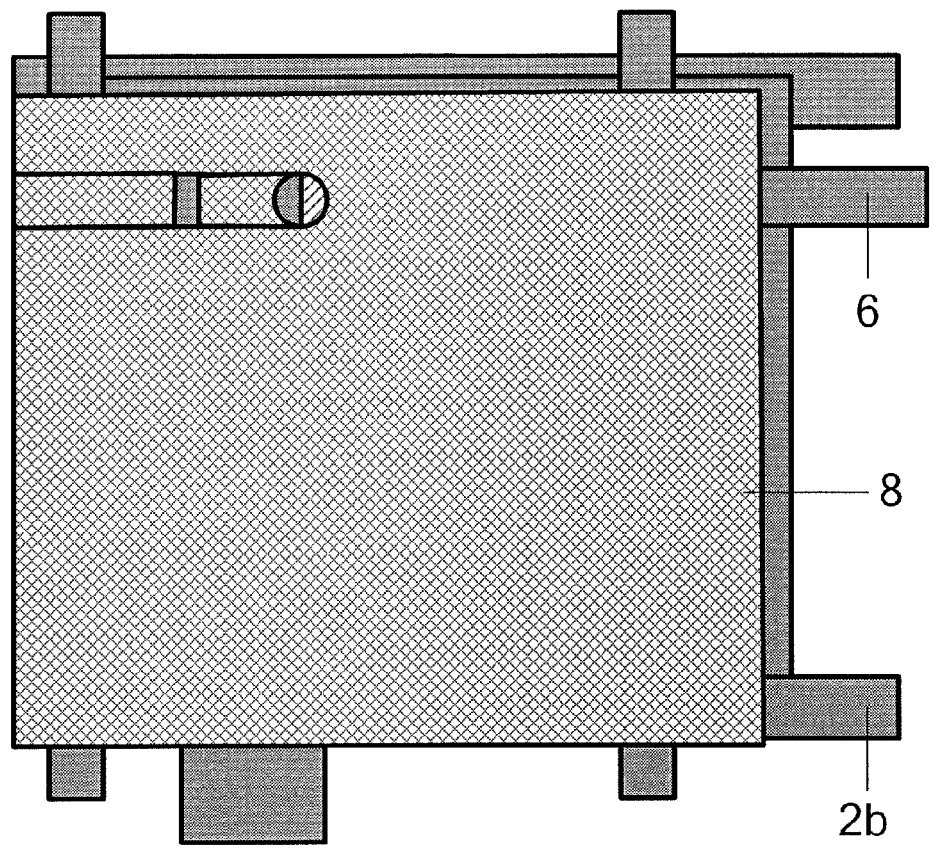
FIG. 8 is a schematically top view illustrating the structure of one pixel unit after formation of a resin passivation layer according to an embodiment of the method of the invention.

Step 305: a resin passivation layer 8 covering the substrate is formed on the substrate subjected to the step 304, so as to form a second via hole H2, a third via hole H3 and a fourth via hole H4 of the resin passivation layer 8 through a patterning process. The structure of one pixel unit after formation of the resin passivation layer 8 refers to those illustrated in FIG. 7 and FIG. 8.

The second via hole H2 corresponds to the position where a drain electrode is to be formed, the third via hole H3 lies in a signal guiding zone of the substrate and corresponds to the position of the metal wire 6c, and the fourth via hole H4 corresponds to a position between the source electrode 6a and the drain electrode 6b where a channel is to be formed.

In prior art, a silicon nitride material is used as material for a channel protective layer. As the silicon nitride material and a resin material have different lateral etching rates, an undesirable chamfering of a via hole at the channel will be brought about once a channel protective layer of silicon nitride under the resin passivation layer 8 has a fast lateral etching rate. In embodiments of the invention, the source electrode 6a and the drain electrode 6b are not formed in the step 305, and the active layer 4 at the channel is covered by the source/drain metal, so that an impact on the active layer at the channel by the resin passivation layer is avoided, a problem of undesirable chamfering upon manufacture of the fourth via hole H4 in this step is effectively addressed, and yield of the product is raised.

Step 306, a transparent, conductive thin film covering the substrate is formed on the substrate subjected to the step 305, so as to form the source electrode 6a, the drain electrode 6b, a fifth via hole H5 of the ohmic layer 5 and a first transparent electrode 9 through a patterning process.

The fifth via hole H5 corresponds to the position of the fourth via hole H4 of the resin passivation layer 8. Material for the transparent, conductive metal thin film may be indium tin oxide, or the like.

Figure 9:
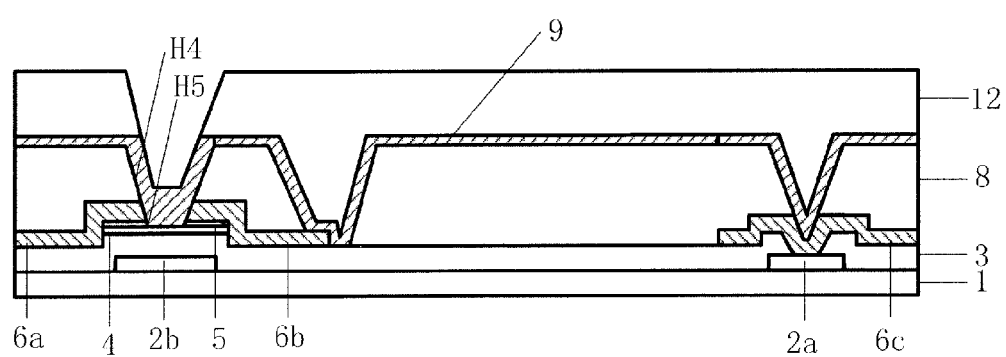
FIG. 9 is a schematically sectional view illustrating the structure of one pixel unit after formation of a transparent, conductive metal thin film according to an embodiment of the method of the invention.

For example, as illustrated in FIG. 9, in this step, a transparent, conductive thin film covering the substrate is formed, and photoresist 12 is exposed through a patterning process using a half-tone mask so as to form a source electrode 6a, a drain electrode 6b and a fifth via hole H5 of the ohmic layer 5. The fifth via hole H5 corresponds to the position of the fourth via hole 1-14.

Figure 10:
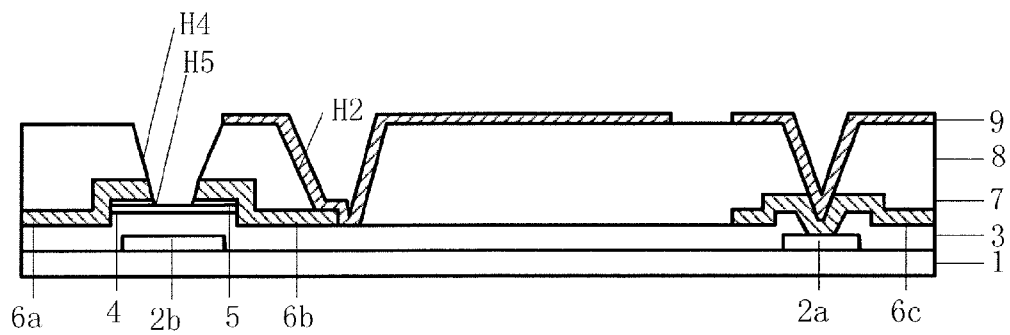
FIG. 10 is a schematically sectional view illustrating the structure of one pixel unit after formation of a source electrode, a drain electrode and a first transparent electrode according to an embodiment of the method of the invention.
Figure 11:
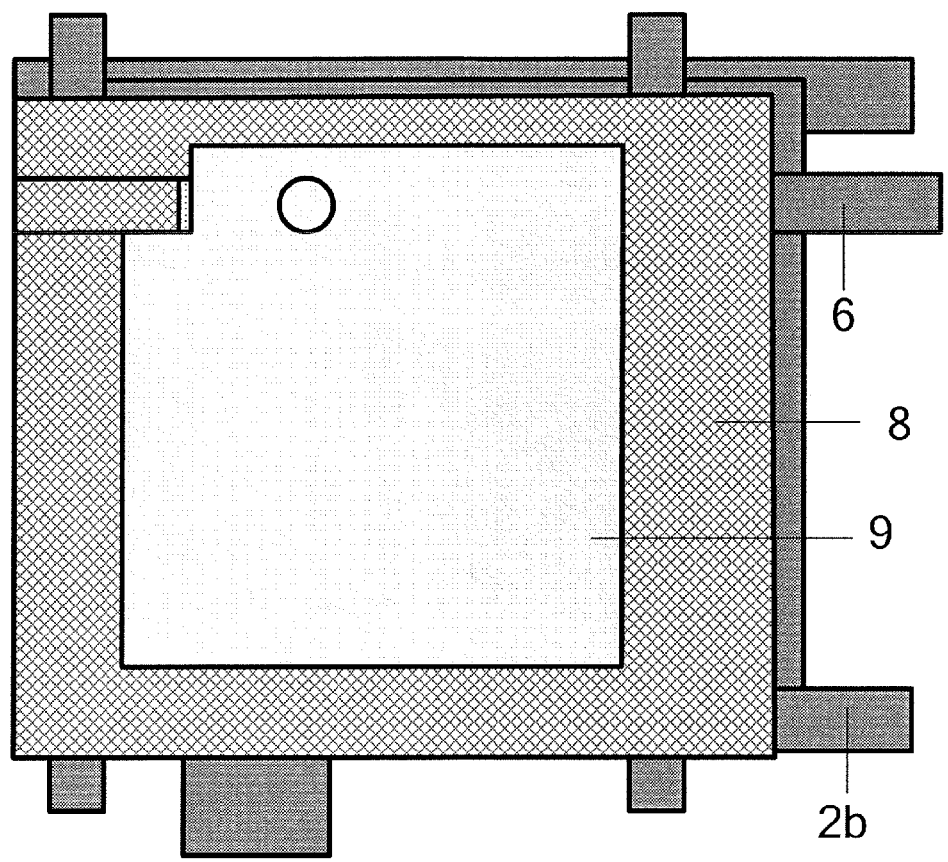
FIG. 11 is a schematically top view illustrating the structure of one pixel unit after formation of a source electrode, a drain electrode and a first transparent electrode according to an embodiment of the method of the invention.

A first transparent electrode 9 is formed through a patterning process using a gray-tone mask. The structure of one pixel unit after formation of the source electrode 6a, the drain electrode 6b and the first transparent electrode 9 refers to those illustrated in FIG. 10 and FIG. 11. The first transparent electrode 9 is connected to a metal layer to be formed into the drain electrode 6b through a second via hole H2.

Figure 12:
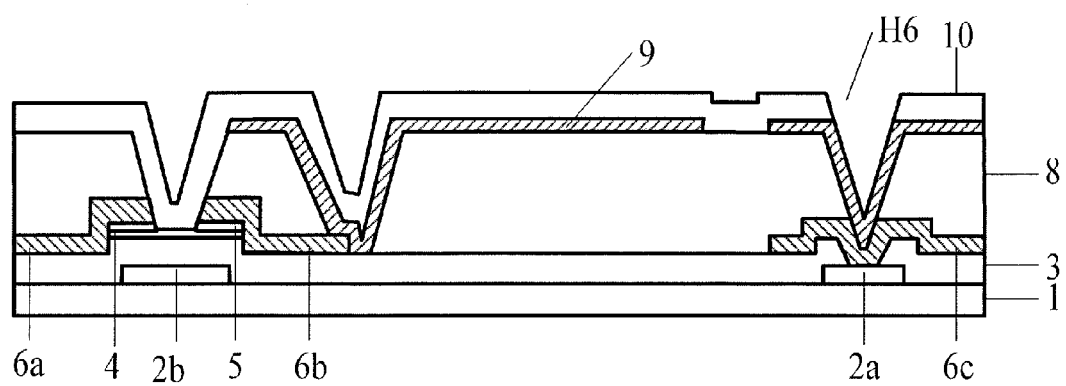
FIG. 12 is a schematically sectional view illustrating the structure of one pixel unit after formation of a second passivation layer according to an embodiment of the method of the invention.

Step 307, a second passivation layer 10 covering the substrate is formed on the substrate subjected to the step 306, so as to form a sixth via hole H6 of the second passivation layer 10 in a signal guiding zone of the substrate through a patterning process. A sectional structure of one pixel unit after formation of the second passivation layer 10 refers to that illustrated in FIG. 12.

Step 308: a transparent, conductive thin film covering the substrate is formed on the substrate subjected to the step 307, so as to form a second transparent electrode 11 having a slit structure through a patterning process. A sectional structure of one pixel unit for the array substrate according to an embodiment of the invention refers to that illustrated in FIG. 1.

For example, in the above manufacturing method, the resin passivation layer 8 contacts with the source electrode 6a and the drain electrode 6b directly; and the second passivation layer 10 contacts with the active layer directly.

As can be seen that, manufacture of a channel protective layer is omitted in the manufacturing method of the array substrate according to embodiments of the invention, so that the manufacturing cost is reduced, the producing process is simplified, and the yield of the product is greatly promoted.

Descriptions made above are merely exemplary embodiments of the invention, but are not used to limit the protection scope of the invention. The protection scope of the invention is determined by attached claims.

The invention claimed is:

1. An array substrate, comprising:

a base substrate and a plurality of pixel units located on the base substrate, each of the pixel units including a thin film transistor unit, wherein, the thin film transistor unit includes: a gate electrode located on the base substrate, a gate insulating layer located on the gate electrode, an active layer located on the gate insulating layer and opposed to the gate electrode in position, an ohmic layer located on the active layer, a source electrode and a drain electrode that are located on the ohmic layer and a resin passivation layer that are located on the source electrode and the drain electrode and covers the substrate, wherein, the resin passivation layer contacts with the source electrode and the drain electrode directly, and the resin passivation layer has a via hole passing therethrough for exposing a channel between the source electrode and the drain electrode.

2. The array substrate claimed as claim 1, further comprising: a first transparent electrode located on the resin passivation layer, a second passivation layer that is located on the first transparent electrode and covers the substrate, and a second transparent electrode that is located on the second passivation layer and has a slit structure.

3. The array substrate claimed as claim 1, wherein, the resin passivation layer has a material of photosensitive resin.

4. The array substrate claimed as claim 2, wherein, the second passivation layer contacts with the active layer directly.

5. The array substrate claimed as claim 1, further comprising a gate drive unit, which includes: a wire-zone gate electrode that is located on the base substrate and covered by the gate insulating layer, and a metal wire located on the gate insulating layer.

6. A display device, comprising the array substrate claimed as claim 1.

7. The array substrate claimed as claim 2, wherein, the resin passivation layer has a material of photosensitive resin.

8. The array substrate claimed as claim 2, further comprising a gate drive unit, which includes: a wire-zone gate electrode that is located on the base substrate and covered by the gate insulating layer, and a metal wire located on the gate insulating layer.

9. The array substrate claimed as claim 2, wherein the second passivation layer is in direct contact with the active layer.

10. A manufacturing method of an array substrate, comprising:

forming a data line metal thin film that is located on an active layer and an ohmic layer and covers a substrate, so as to form source/drain metal, a metal wire and a data scan line through a patterning process;

forming a resin passivation layer that is located on the source/drain metal, the metal wire and the data scan line and covers the substrate, and forming a second via hole, a third via hole and a fourth via hole in the resin passivation layer through a patterning process, the second via hole being in correspondence with a position where a drain electrode is to be formed, the third via hole being in correspondence with the position of the metal wire, the fourth via hole being in correspondence with a position between a source electrode and the drain electrode where a channel is to be formed;

forming a transparent, conductive metal thin film that is located on the resin passivation layer and covers the substrate, so as to form the source electrode, the drain electrode, a fifth via hole of the ohmic layer and a first transparent electrode through a patterning process, the fifth via hole being in correspondence with the position of the fourth via hole.

11. The manufacturing method of the array substrate claimed as claim 10, wherein, before the forming of the data line metal thin film that is located on the active layer and the ohmic layer and covers the substrate so as to form the source/drain metal, the metal wire and the data scan line through the patterning process, the method further includes:

forming a gate metal thin film on the base substrate, so as to form patterns of a first gate electrode, a second gate electrode and a gate scan line connected to the second gate electrode through a patterning process; the first gate electrode being located under the metal wire, and the second gate electrode being located under the active layer;

forming a gate insulating layer, an active material layer and an ohmic material layer that are located on the first gate electrode, the second gate electrode and the gate scan line, so as to form the active layer and the ohmic layer through a patterning process;

forming a first via hole of the gate insulating layer in a position corresponding to the first gate electrode through a patterning process.

12. The manufacturing method of the array substrate claimed as claim 10, wherein, after the forming of the transparent, conductive metal thin film that is located on the resin passivation layer and covers the substrate so as to form the source electrode, the drain electrode, the fifth via hole of the ohmic layer that corresponds to the position of the fourth via hole and the first transparent electrode, the method further includes:

forming a second passivation layer that is located on the first transparent electrode and covers the substrate, so as to form a sixth via hole of the second passivation layer in a position corresponding to the third via hole through a patterning process.

13. The manufacturing method of the array substrate claimed as claim 12, further comprising, forming a transparent, conductive metal thin film that is located on the second passivation layer and covers the substrate, so as to form a second transparent electrode having a slit structure through a patterning process.

14. The manufacturing method of the array substrate claimed as claim 11, wherein, the forming of the gate insulating layer, the active material layer and the ohmic material layer that are located on the patterns of the first gate electrode, the second gate electrode and the gate scan line so as to form the active layer and the ohmic layer through a patterning process includes:

forming the gate insulating layer, the active material layer and the ohmic material layer that are located on the patterns of the first gate electrode, the second gate electrode and the gate scan line connected to the second gate electrode in sequence;

forming the active layer and the ohmic layer through a patterning process using a half-tone mask.

15. The manufacturing method of the array substrate claimed as claim 10, wherein, the forming of the transparent, conductive metal thin film that is located on the resin passivation layer and covers the substrate so as to form the source electrode, the drain electrode, the fifth via hole of the ohmic layer that corresponds to the position of the fourth via hole and the first transparent electrode through a patterning process includes:

forming a transparent, conductive metal thin film that is located on the resin passivation layer and covers the substrate, so as to form the source electrode, the drain electrode and the fifth via hole of the ohmic layer corresponding to the position of the fourth via hole through a patterning process using a half-tone mask;

forming the first transparent electrode through a patterning process using a gray-tone mask.

16. The manufacturing method of the array substrate claimed as claim 10, wherein, the resin passivation layer contacts with the source electrode and the drain electrode directly.

17. The manufacturing method of the array substrate claimed as claim 10, wherein, the resin passivation layer has a material of photosensitive resin.

18. The manufacturing method of the array substrate claimed as claim 11, wherein, the forming of the transparent, conductive metal thin film that is located on the resin passivation layer and covers the substrate so as to form the source electrode, the drain electrode, the fifth via hole of the ohmic layer that corresponds to the position of the fourth via hole and the first transparent electrode through a patterning process includes:

forming a transparent, conductive metal thin film that is located on the resin passivation layer and covers the substrate, so as to form the source electrode the drain electrode and the fifth via hole of the ohmic layer corresponding to the position of the fourth via hole through a patterning process using a half-tone mask;

forming the first transparent electrode through a patterning process using a gray-tone mask.

19. The manufacturing method of the array substrate claimed as claim 11, wherein, the resin passivation layer contacts with the source electrode and the drain electrode directly.

* * * * *